(12) United States Patent
Zhang et al.

(10) Patent No.: US 12,403,511 B2
(45) Date of Patent: Sep. 2, 2025

(54) DEVICES FOR AUTOMATIC CLEANING OF A MONOCRYSTALLINE SILICON BAR

(71) Applicant: TCL ZHONGHUAN RENEWABLE ENERGY TECHNOLOGY CO., LTD., Tianjin (CN)

(72) Inventors: Haiming Zhang, Tianjin (CN); Xuzhou Yang, Tianjin (CN); Haoming Zhang, Tianjin (CN); Chen Wei, Tianjin (CN); Junwen Guo, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 0 days.

(21) Appl. No.: 18/555,232

(22) PCT Filed: Jul. 31, 2023

(86) PCT No.: PCT/CN2023/110378
§ 371 (c)(1),
(2) Date: Oct. 12, 2023

(87) PCT Pub. No.: WO2024/041321
PCT Pub. Date: Feb. 29, 2024

(65) Prior Publication Data
US 2025/0083197 A1    Mar. 13, 2025

(30) Foreign Application Priority Data
Aug. 23, 2022 (CN) .......................... 202222229194.5

(51) Int. Cl.
B08B 13/00     (2006.01)
B08B 1/16      (2024.01)
(Continued)

(52) U.S. Cl.
CPC .................. *B08B 5/02* (2013.01); *B08B 1/16* (2024.01); *B08B 1/32* (2024.01); *B08B 3/02* (2013.01); *B08B 2220/01* (2013.01)

(58) Field of Classification Search
None
See application file for complete search history.

(56) References Cited

FOREIGN PATENT DOCUMENTS

| CN | 207057070 U | 3/2018 |
|---|---|---|
| CN | 108155118 A | 6/2018 |

(Continued)

OTHER PUBLICATIONS

Google Patents translation of CN 215466425 (Year: 2025).*
(Continued)

*Primary Examiner* — Eric W Golightly
(74) *Attorney, Agent, or Firm* — PV IP PC; Wei Te Chung

(57) ABSTRACT

Provided are automatic cleaning devices for a monocrystalline silicon bar, which include a base frame, a sprayer, a scrubber, and an air-jetter. Bottom of an inner side of the base frame is configured to place a monocrystalline silicon bar. A plurality of groups of the sprayers, a plurality of groups of the scrubbers, and a plurality of groups of the air-jetters are all disposed on side walls and a top surface of the base frame whose bottom of an inner side is removed. The sprayer is configured to spray the monocrystalline silicon bar. The scrubber is configured to scrub the monocrystalline silicon bar. The air-jetter is configured to purge the monocrystalline silicon bar.

12 Claims, 1 Drawing Sheet

(51) Int. Cl.
 *B08B 1/32* (2024.01)
 *B08B 3/02* (2006.01)
 *B08B 5/02* (2006.01)

(56) References Cited

FOREIGN PATENT DOCUMENTS

| | | |
|---|---|---|
| CN | 208728131 U | 4/2019 |
| CN | 215466425 U | 1/2022 |
| CN | 218167929 U | 12/2022 |
| JP | 2007194367 A | 8/2007 |

OTHER PUBLICATIONS

Google Patents translation of CN108155118A (Year: 2025).*
Google Patents translation of CN207057070 (Year: 2025).*
Google Patents translation of CN208728131U (Year: 2025).*
International Search Report in International application No. PCT/CN2023/110378, mailed on Oct. 25, 2023. 3 pages.
Written Opinion of the International Search Authority in International application No. PCT/CN2023/110378, mailed on Oct. 25, 2023, 5 pages.

* cited by examiner

DEVICES FOR AUTOMATIC CLEANING OF A MONOCRYSTALLINE SILICON BAR

CROSS-REFERENCE TO RELATED APPLICATION

The present disclosure claims priority to and the benefit of Chinese Patent Application No. 202222229194.5, filed on Aug. 23, 2022, the disclosure of which is incorporated herein by reference in its entirety.

TECHNICAL FIELD

The present disclosure relates to cutting of solar monocrystalline silicon wafers, and in particular, to devices for automatic cleaning of a monocrystalline silicon bar.

BACKGROUND

With the proposal of national carbon neutrality, the solar photovoltaic industry is facing a new development trend. The demand for monocrystalline silicon wafers is increasing rapidly, the manufacturing technology of silicon wafers is continuously upgraded, and size of the silicon wafers is gradually moving towards large-diameter and ultra-thin. However, large-area ultra-thin silicon wafers have higher requirements on quality index of the silicon wafers, and difficulty of manufacturing is further increased. Currently there is a large demand for photovoltaic silicon wafers, and industrial modes with automation, less manpower, high efficiency and the like in the production process of silicon wafers are to be developed.

During the production of silicon wafers, monocrystalline silicon bars need to be transferred from a material storage to a linear cutting machine through an assembly line. The impurities, glue spots and oil stains left on the surface of the monocrystalline silicon bars need to be cleaned before cutting to avoid affecting the silicon wafer cutting process. Currently, scrubbing of monocrystalline silicon bars is mainly done manually, which is inefficient and has high labor cost. In order to improve the efficiency of scrubbing the monocrystalline silicon bars and meet the increasing production demand, it is necessary to develop devices for automatic cleaning of a monocrystalline silicon bar.

SUMMARY

Embodiments of the present disclosure provide devices for automatic cleaning of a monocrystalline silicon bar, which are particularly suitable to effectively remove impurities on the surface of the monocrystalline silicon bar and improve the efficiency of scrubbing the monocrystalline silicon bar.

An embodiment of the present disclosure provides an device for automatic cleaning of a monocrystalline silicon bar, which includes a base frame, a sprayer, a scrubber, and an air-jetter, wherein bottom of an inner side of the base frame is configured to place a monocrystalline silicon bar; a plurality of groups of the sprayers, a plurality of groups of the scrubbers, and a plurality of groups of the air-jetters are all disposed on side walls and a top surface of the base frame whose inner bottom is removed; the sprayer is configured to spray the monocrystalline silicon bar; the scrubber is configured to scrub the monocrystalline silicon bar; and the air-jetter is configured to purge the monocrystalline silicon bar.

Optionally, the base frame has a frame structure with a placing space inside; the bottom of an inner side of the base frame is provided with a transmission assembly for transmitting the monocrystalline silicon bar; and the transmission assembly runs through and extends out of the base frame along a long edge direction of the base frame.

Optionally, a sensor light source and a light source inductor are disposed at one end of the transmission assembly along a longitudinal direction for detecting whether the monocrystalline silicon bar exists on the transmission assembly.

Optionally, the sensor light source and the light source inductor are disposed on different sides of the transmission assembly; and the sensor light source and the light source inductor are disposed above the transmission assembly at a same height.

Optionally, a blade is disposed at an end of an inner side wall of the base frame near bottom in the longitudinal direction for removing glue particles on a base on which the monocrystalline silicon bar is placed.

Optionally, a plurality of groups of the sprayers are disposed on both side walls and the top surface of the base frame along the long edge direction of the base frame.

Optionally, a plurality of groups of the scrubbers are disposed on both side walls and the top surface of the base frame along the long edge direction of the base frame.

Optionally, a plurality of groups of the air-jetters are disposed on both side walls and the top surface of the base frame along the long edge direction of the base frame.

Optionally, a plurality of groups of the air-jetters are further disposed at ends of both side walls of the base frame along the long edge direction of the base frame.

Optionally, the air-jetter is disposed above the blade and is in parallel with the blade for purging the glue particles shoveled by the blade.

LIST OF REFERENCE NUMBERS

| | | |
|---|---|---|
| 1: Base frame; | 2: Scrubber; | 3: Sensor light source; |
| 4: Light source inductor; | 5: Blade; | 6: Sprayer; |
| 7: Air-jetter; | 8: Transmission assembly. | |

DETAILED DESCRIPTION

The present disclosure will now be further described with reference to the embodiments and the accompanying drawings.

Figure 1:
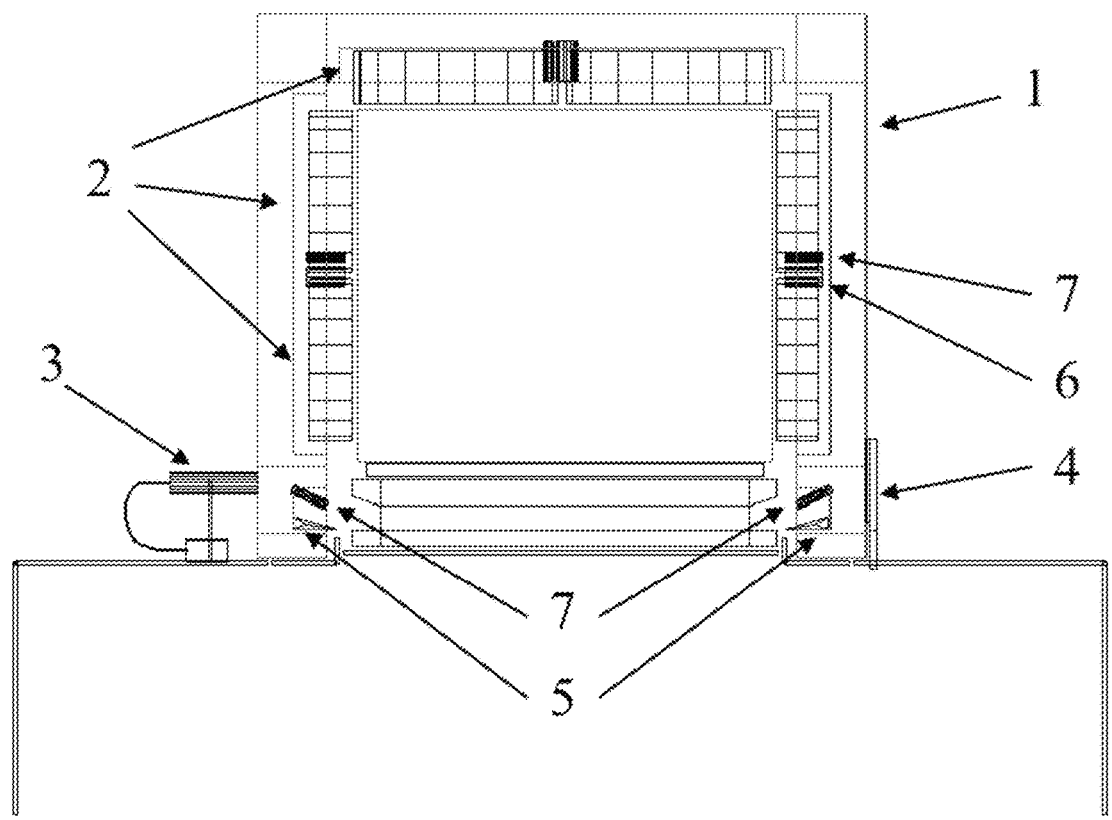
FIG. 1 is a schematic diagram of an overall structure of a device for automatic cleaning of a monocrystalline silicon bar according to an embodiment of the present disclosure.

In an embodiment of the present disclosure, as shown in FIG. 1, a device for automatic cleaning of a monocrystalline silicon bar is provided, which includes a base frame 1, a sprayer 6, a scrubber 2, and an air-jetter 7, wherein a plurality of groups of the sprayers 6, a plurality of groups of the scrubbers 2, and a plurality of groups of the air-jetters 7 are all disposed on side walls and a top surface of an inner side of the base frame 1. Bottom of the inner side of the base frame 1 is used for placing a monocrystalline silicon bar. The plurality of groups of the sprayers 6 are configured to spray the monocrystalline silicon bar placed in the base frame 1. The plurality of groups of the scrubber 2 are configured to scrub the sprayed monocrystalline silicon bar. The plurality of groups of the air-jetter 7 are configured to purge the scrubbed monocrystalline silicon bar.

In this embodiment, the monocrystalline silicon bar to be scrubbed is a square stick before slicing. The impurities, glue spots, oil stains, and the like remaining on the surface of the monocrystalline silicon bar are cleaned before slicing, so as to avoid occurrence of a situation that affects normal slicing of a silicon wafer and quality of a finished silicon wafer. In this embodiment, the square stick is placed on a base, and the automatic cleaning device cleans the square stick together with the base. Since one side of the square stick needs to be placed on the base, only three sides of the square stick except this side need to be cleaned.

Specifically, the base frame 1 has a frame structure with a placing space inside. In this embodiment, the base frame 1 is a frame structure with openings at both ends and a hollow inside, and bottom of the frame structure is a supporting frame body. The bottom of an inner side of the base frame 1 is provided with a transmission assembly 8, and the transmission assembly 8 runs through the base frame 1 along a long edge direction of the base frame 1. The square stick is placed on the transmission assembly 8, and completely transmitted into the base frame 1 through the transmission assembly 8. The transmission assembly 8 is a conveyor belt. It is conceivable that as an alternative, the transmission assembly 8 can also adopt a structure with a function of transmitting such as a roller to transmit the square stick. In this embodiment, a long edge direction of the base frame 1 is defined as the transmission direction of the square stick.

Figure 2:
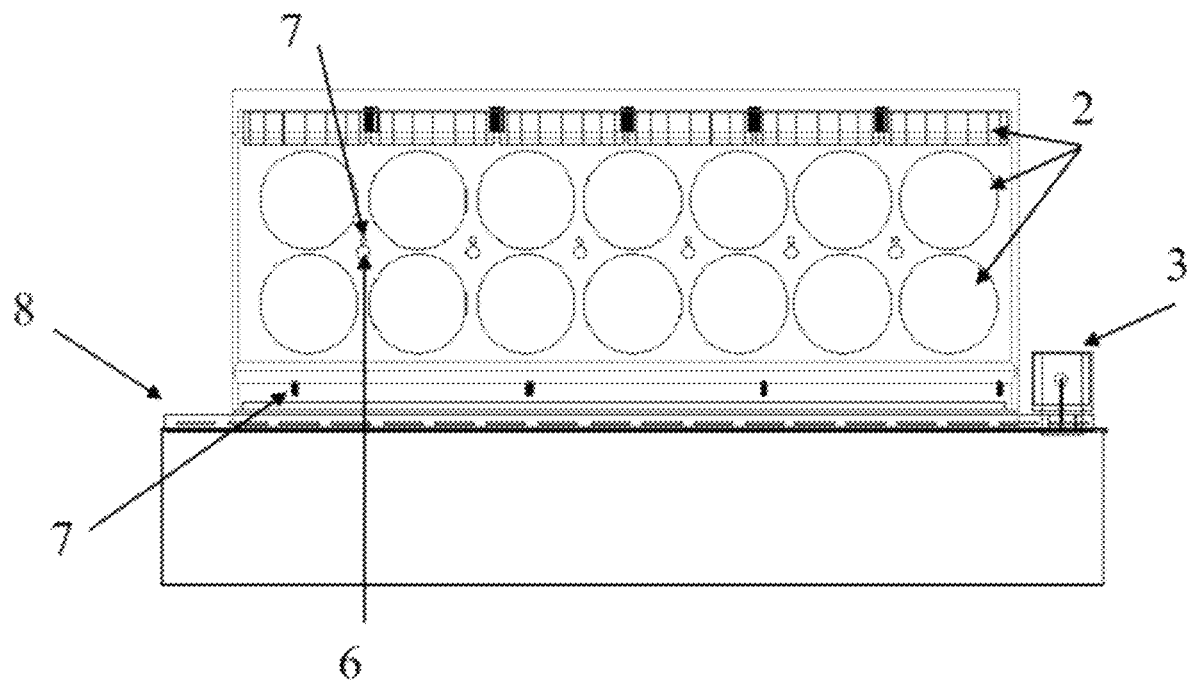
FIG. 2 is a top view of a device for automatic cleaning of a monocrystalline silicon bar according to an embodiment of the present disclosure.

Specifically, a sensor light source 3 and a light source inductor 4 are disposed at one end of the transmission assembly 8 along a longitudinal direction for detecting whether the monocrystalline silicon bar exists on the transmission assembly 8. The sensor light source 3 and the light source inductor 4 are disposed on different sides of the transmission assembly 8. The sensor light source 3 and the light source inductor 4 are disposed above the transmission assembly 8 at a same height. As shown in FIGS. 1 to 2, in this embodiment, the sensor light source 3 and the light source inductor 4 are disposed at one end of the transmission assembly 8 transmitting the square stick out, so that the whole square stick is transmitted into the base frame 1 along a direction parallel to a longitudinal direction of the transmission assembly. When the sensor light source 3 and the light source inductor 4 are blocked by the square stick, the transmission assembly 8 stops running, and the stopped crystal bar is sprayed, scrubbed and blown. In this embodiment, the longitudinal direction of the transmission assembly 8 is also the transmission direction of the square stick.

Specifically, a plurality of groups of the sprayers 6, a plurality of groups of the scrubbers 2 and a plurality of groups of the air-jetters 7 are disposed on both side walls and the top surface of the base frame 1 along the long edge direction of the base frame 1. In this embodiment, as shown in FIG. 2, a plurality of groups of the sprayers 6 and a plurality of groups of the air-jetters 7 are disposed corresponding to each other on both side walls and the top surface of the base frame 1 along the long edge direction of the base frame 1. Similarly, a plurality of rows of the scrubbers 2 are regularly disposed on both side walls and the top surface of the base frame 1 along the long edge direction of the base frame 1. In this embodiment, two rows of the scrubbers 2 are respectively disposed on both side walls and the top surface of the base frame 1 along the long edge direction. The sprayers 6 and the air-jetters 7 are disposed in the gaps of the scrubbers 2 that are disposed in two rows on one side, so as to realize multi-directional spraying and all-round scrubbing, and the impurities on the surface of the monocrystalline silicon bar can be effectively removed without damaging the surface of the monocrystalline silicon bar, thus improving the scrubbing efficiency of the monocrystalline silicon bar.

The sprayer 6 includes a spraying nozzle, a water path, an air path, a pipeline, a liquid storage tank, and the like. Liquid in the liquid storage tank is sprayed out from the spraying nozzle after flowing through the water path through a pipeline. Meanwhile, during the spraying process, air pressure is ensured to be stable through air circuit circulation. The air-jetter 7 includes an air-jetting nozzle, an air path pipe, and the like, gas passing through the air path pipe is jetted by the air-jetting nozzle. In this embodiment, the spraying nozzle and the air-jetting nozzle are disposed in the gaps of two adjacent pairs of the scrubbers 2 that are disposed on both side walls and the top surface of the base frame 1 along the long edge direction.

The scrubber 2 is a scrubbing assembly driven by a rotating motor, and each scrubbing assembly is connected with the base frame 1 through a rotating motor. The scrubbing assembly may be connected, but is not limited to, a rotating shaft which is connected in rotation. The scrubbing assembly is coated with a cotton cloth strip or other flexible scrubbing material. During operation, outside of the monocrystalline silicon bar is scrubbed while rotating.

Specifically, since glue particles will drop into grooves of the base frame 1, a blade 5 is disposed at an end of an inner side wall of the base frame 1 near the bottom, and the blade 5 is connected to the inner side wall of the base frame 1 through an air cylinder, so as to remove the glue particles on the base of the monocrystalline silicon bar by pushing the blade 5 through the air cylinder. In this embodiment, the blade 5 is disposed at an end of an inner side wall of the base frame near the bottom in the longitudinal direction of the base frame 1. Similarly, a plurality of groups of the air-jetters are disposed above the blade 5 along the long edge direction of the base frame 1. In this embodiment, there are two blades 5. The air cylinder is connected with the base frame 1, a movable end of the air cylinder is connected with the blade 5. The air cylinder pushes the blade 5 to move horizontally in the direction close to or away from the base. A plurality of groups of the air-jetters 7 are disposed above the blade 6 and are in parallel with the blade 5 to purge the glue particles shoveled by the blade 5.

Working procedure of an embodiment of the present disclosure is as follows:

A monocrystalline silicon bar is transmitted to a sensor light source 3 and a light source inductor 4 through a transmission assembly 8, and the operation of the transmission assembly 8 is stopped through feedback. A sprayer 6 starts spraying the monocrystalline silicon bar, specifically, the sprayer 6 sprays a cleaning liquid. After the spraying, a scrubber 2 and a blade 5 are started. The scrubber 2 is driven by a rotating motor to operate. The blade 5 moves back and forth through an air cylinder to scrub the surface of the monocrystalline silicon bar while removing the glue particles on a base. After cleaning, the scrubber 2 and the blade 5 are stopped in sequence, and an air-jetter 7 is started to jet air for cleaning. After air-jetting is completed, the air-jetter 7 is stopped, and the transmission assembly 8 is started to transmit the monocrystalline silicon bar away. The above steps are repeated continuously to scrub a plurality of monocrystalline silicon bars.

The remaining impurities, glue dots, and oil stains on the surface of the monocrystalline silicon bar before cutting can be cleaned by the sprayer, the scrubber, the blade, and the air-jetter in sequence, so that cutting accuracy and quality of the silicon wafer are improved. Further, the above method has a high production efficiency, and a reduced labor cost through mechanization operation, thereby meeting the increasing production demand.

By means of multi-directional spraying, all-round scrubbing and air blowing, impurities on the surface of the monocrystalline silicon bar can be effectively removed without damaging the surface of the monocrystalline silicon bar, thereby improving the scrubbing efficiency of the monocrystalline silicon bar.

Embodiments of the present disclosure have been described in detail above, but the contents are merely preferred embodiments of the disclosure, which are not intended to limit scope of implementation of the present disclosure. All equivalent changes and modifications made in accordance with the scope of the present disclosure shall still fall within the scope of the present disclosure.

What is claimed is:

1. A device for automatic cleaning of a monocrystalline silicon bar, configured to clean the monocrystalline silicon bar before slicing, and comprising a base frame, a plurality of groups of sprayers, a plurality of groups of scrubbers, a plurality of groups of air-jetters, and a blade, wherein a bottom of an inner side of the base frame is configured to hold the monocrystalline silicon bar;

the sprayers, the scrubbers and the air-jetters are disposed on side walls of the base frame except the bottom of the inner side or on a top surface of the base frame;

the sprayers are configured to spray the monocrystalline silicon bar;

the scrubbers are configured to scrub the monocrystalline silicon bar;

the air-jetters are configured to purge the monocrystalline silicon bar; and the blade is disposed at an end of an inner side wall of the base frame near the bottom in a long side direction for removing glue particles on a material holder on which the monocrystalline silicon bar is placed.

2. The device according to claim 1, further comprising a conveyor belt for transmitting the monocrystalline silicon bar, wherein the base frame has a frame structure with a placement space provided therein;

the conveyor belt is disposed on the bottom of the inner side of the base frame; and the conveyor belt is configured to extend through and from the base frame along a long side of the base frame.

3. The device according to claim 2, further comprising a sensor light source and a light source inductor disposed at an end of the conveyor belt in a length direction for detecting presence of the monocrystalline silicon bar on the conveyor belt.

4. The device according to claim 3, wherein the sensor light source and the light source inductor are disposed respectively on different sides of the conveyor belt; and the sensor light source and the light source inductor are disposed at a same height above the conveyor belt.

5. The device according to claim 1, wherein the plurality of groups of the sprayers are disposed respectively on both side walls of the base frame in a long side direction of the base frame and on the top surface.

6. The device according to claim 1, wherein the plurality of groups of the scrubbers are disposed respectively on both side walls of the base frame in a long side direction of the base frame and on the top surface.

7. The device according to claim 1, wherein the plurality of groups of the air-jetters are disposed respectively on both side walls of the base frame in the long side direction of the base frame and on the top surface.

8. The device according to claim 7, further comprising additional air-jetters disposed at respective ends of both side walls of the base frame near the bottom in the long side direction of the base frame.

9. The device according to claim 8, wherein each of the additional air-jetters is disposed above the blade and in parallel with the blade for purging the glue particles removed by the blade.

10. The device according to claim 4, wherein the sensor light source and the light source inductor are disposed on opposite sides of the conveyor belt in a direction perpendicular to a transmission direction of the monocrystalline silicon bar, and the sensor light source and the light source inductor are configured in conjunction with each other to detect whether the monocrystalline silicon bar is transmitted therebetween.

11. The device according to claim 2, wherein the conveyor belt is configured to transmit the monocrystalline silicon bar to a position where the monocrystalline silicon bar is to be cleaned, is configured to stop transmitting the monocrystalline silicon bar during cleaning, and is configured to continue transmitting the monocrystalline silicon bar after cleaning.

12. The device according to claim 11, wherein after the monocrystalline silicon bar is transmitted to the position where the monocrystalline silicon bar is to be cleaned, the sprayers are configured to spray cleaning liquid to the monocrystalline silicon bar; after spraying, the scrubbers are configured to scrub outside of the monocrystalline silicon bar, and the blade is configured to remove the glue particles on the material holder; after cleaning of the scrubbers and the blade, the scrubbers and the blade are stopped in sequence, and the air-jetters are configured to jet air for cleaning; and after cleaning of the air-jetters, the air-jetters are stopped, and the conveyor belt is configured to start transmitting the monocrystalline silicon bar away.

* * * * *